United States Patent
Ito et al.

(10) Patent No.: US 7,018,932 B2
(45) Date of Patent: Mar. 28, 2006

(54) METHOD FOR MANUFACTURING A SEMICONDUCTOR DEVICE AND APPARATUS FOR MANUFACTURING A SEMICONDUCTOR DEVICE

(75) Inventors: Shinichi Ito, Yokohama (JP); Tatsuhiko Higashiki, Fujisawa (JP); Katsuya Okumura, Tokyo (JP); Kenji Kawano, Yokohama (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/377,597

(22) Filed: Mar. 4, 2003

(65) Prior Publication Data

US 2004/0033448 A1 Feb. 19, 2004

(30) Foreign Application Priority Data

Mar. 4, 2002 (JP) .................................... 2002-057758

(51) Int. Cl.
*H01L 21/027* (2006.01)
*G03F 9/00* (2006.01)

(52) U.S. Cl. ........................ 438/708; 438/681; 430/30
(58) Field of Classification Search ................ 438/708
See application file for complete search history.

(56) References Cited

U.S. PATENT DOCUMENTS 6,002,467 A * 12/1999 Nishi et al. ................ 355/61
6,191,397 B1   2/2001 Hayasaki et al. .......... 219/497
6,376,139 B1   4/2002 Fujisawa et al. ........... 430/30
RE38,113 E  *  5/2003 Nishi et al. ................. 430/22
6,696,363 B1 *  2/2004 Lee et al. .................. 438/681

FOREIGN PATENT DOCUMENTS

JP   2000-299271   10/2000
JP   2001-244176    9/2001

OTHER PUBLICATIONS

Hayasaki, K. et al., "Pattern Forming Method Using Photolithography", U.S. Appl. No. 09/893,485, filed on Jun. 29, 2001.

* cited by examiner

*Primary Examiner*—James Vannucci
(74) *Attorney, Agent, or Firm*—Finnegan, Henderson, Farabow, Garrett & Dunner, L.L.P.

(57) ABSTRACT

A method for manufacturing a semiconductor device including, forming a photosensitive-film on a substrate, carrying the substrate on which the photosensitive-film is formed, to an exposure device provided with a mask in which an on-mask-inspection-mark and an on-mask-device-pattern are formed, selectively exposing the photosensitive-film to light to transfer the on-mask-inspection-mark to the photosensitive-film to form a latent-image of the inspection-mark on the photosensitive-film, heating at least that area of the photosensitive-film in which the latent-image of the inspection-mark is formed, measuring the inspection-mark, changing set-values for the exposure device used for the selective exposure, on the basis of result of the measurement so that exposure conditions conform to the set-values, exposing the photosensitive-film on the basis of the changed set-values to transfer the on-mask-device-pattern to the photosensitive-film to form a latent image of the device-pattern on the photosensitive-film, heating an entire surface of the photosensitive-film, and developing the photosensitive-film.

16 Claims, 5 Drawing Sheets

METHOD FOR MANUFACTURING A SEMICONDUCTOR DEVICE AND APPARATUS FOR MANUFACTURING A SEMICONDUCTOR DEVICE

CROSS-REFERENCE TO RELATED APPLICATIONS

This application is based upon and claims the benefit of priority from the prior Japanese Patent Application No. 2002-57758, filed Mar. 4, 2002, the entire contents of which are incorporated herein by reference.

BACKGROUND OF THE INVENTION

1. Field of the Invention

The present invention relates to a method for manufacturing a semiconductor device without reworking and an apparatus for manufacturing a semiconductor device.

2. Description of the Related Art

A lithography step for a semiconductor integrated circuit comprises coating of a wafer with a photosensitive film and the following exposure of the photosensitive film, followed by its development. This lithography step requires a pattern in an upper layer to be aligned with a pattern in a lower layer before exposure is carried out using these patterns. FIG. 6 shows a flowchart of a conventional lithography step.

An alignment mark is provided on a semiconductor substrate for alignment with a pattern located above the substrate. A photosensitive film is formed on the semiconductor film (S201). In some cases, an antireflective film and a photosensitive film are sequentially formed on the semiconductor substrate (S202). Then, an exposure position, dose, and the height of the substrate are set (S203). An exposure device comprises an alignment mechanism that detects the position of a lower layer pattern. The alignment mechanism detects the position of an alignment mark arranged under the photosensitive film to calculate a position at which the photosensitive film is exposed using the pattern in the upper layer. Alignment is carried out on the basis of this positional information. Then, exposure is carried out using a device pattern (S204). The substrate is unloaded from the exposure device (S205). Then, the entire surface of the photosensitive film is subjected to PEB and development (S206) to form a photosensitive film pattern.

To increase an efficiency percentage, a misalignment inspection is carried out to check whether or not the photosensitive film pattern is aligned with a pattern formed in the underlying film (S207). For the misalignment inspection, an inspection device measures the positions of a misalignment inspection mark in the photosensitive film pattern and of a misalignment inspection mark formed in the underlying layer.

If the results of the inspection indicate that the magnitude of misalignment is out of an allowable range, the photosensitive film (in some cases, an antireflective film) is released (S208). Then, the exposure position, dose, and substrate height are corrected (S209). Subsequently, a process starting with the coating with a photosensitive film and ending with its development (S201 to S206), i.e. so-called reworking must be executed again. Reworking may have to cover the order of one lot. This increases the time required for manufacturing.

As described above, if the results of the misalignment inspection indicate that the magnitude of misalignment is out of the allowable range, reworking must be carried out. This increases manufacturing costs.

BRIEF SUMMARY OF THE INVENTION (1) According to an aspect of the present invention, there is provided an exposure method comprising forming a photosensitive film on a main surface of a semiconductor substrate; carrying the semiconductor substrate on which the photosensitive film is formed, to an exposure device provided with a mask in which an on-mask inspection mark and an on-mask device pattern are formed to form an inspection mark and a device pattern, respectively, on the photosensitive film; selectively exposing the photosensitive film to light to transfer the on-mask inspection mark to the photosensitive film to form a latent image of the inspection mark on the photosensitive film; heating at least that area of the photosensitive film in which the latent image of the inspection mark is formed, to relieve the image of the inspection mark; measuring the relieved image of the inspection mark; changing set values for the exposure device used for the selective exposure, on the basis of result of the measurement so that exposure conditions conform to the set values; exposing the photosensitive film on the basis of the changed set values to transfer on-mask device pattern to the photosensitive film to form a latent image of the device pattern on the photosensitive film; heating an entire surface of the photosensitive film; and developing the photosensitive film.

(2) According to an aspect of the present invention, there is provided an exposure device comprising a substrate holding section, an exposure mask holding section, a light source, an illuminating optical system which irradiates an exposure mask with light from a light source, a projecting optical system which projects light transmitted through the exposure mask, on a substrate, an alignment mark measuring optical system which detects a position of an alignment mark formed on the substrate, and heating means for selectively heating a part of the substrate held by the substrate holding section, by irradiating this part with light.

DETAILED DESCRIPTION OF THE INVENTION

Embodiments of the present invention will be described with reference to the drawings.
(First Embodiment)

Figure 1:
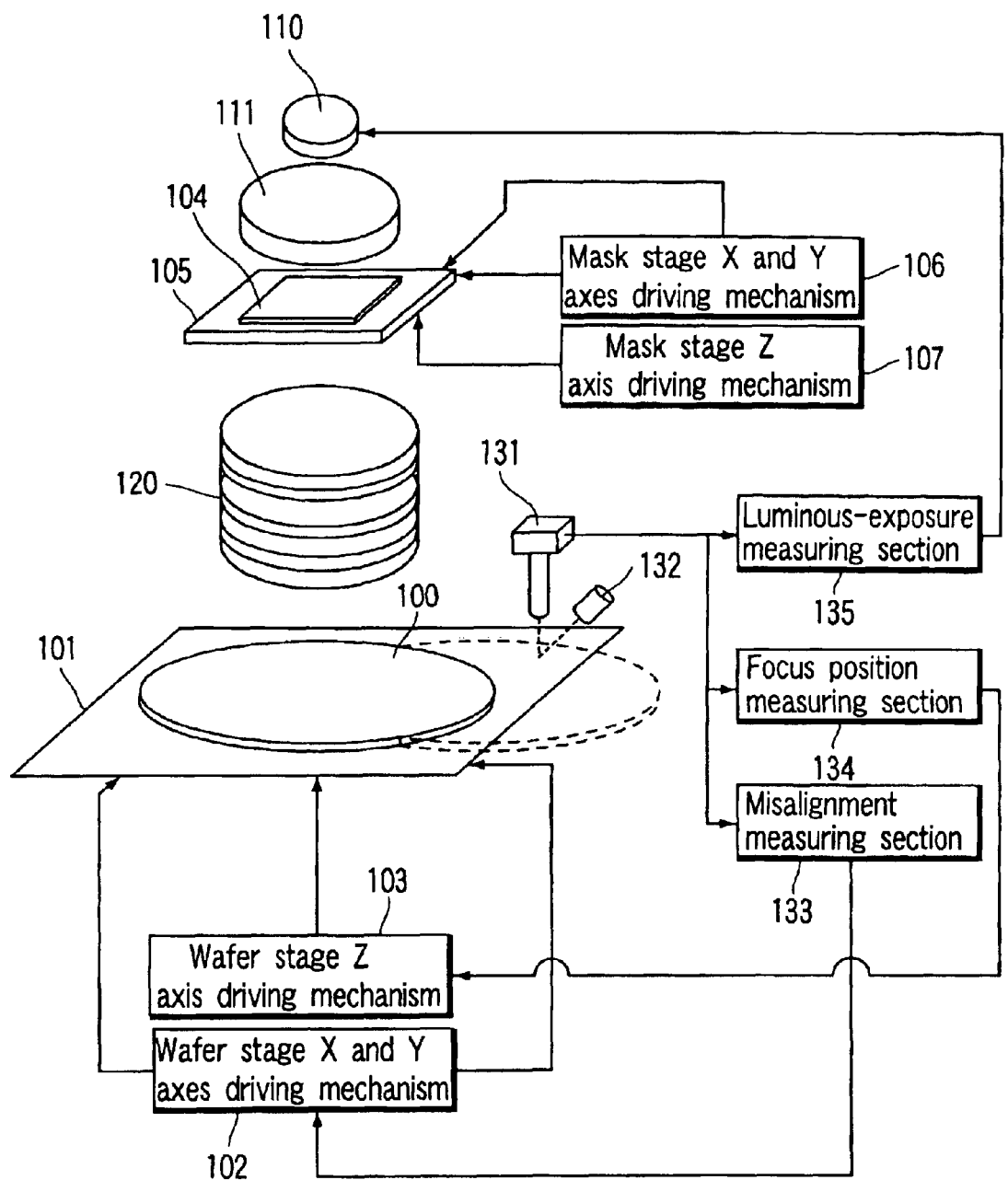
FIG. 1 is a view schematically showing a configuration of an exposure device according to a first embodiment.

The present embodiment relates to a method of manufacturing a semiconductor in which KrF (248 nm) is used as an exposure light source. In the present example, the exposure device shown in FIG. 1 is used.

The exposure device comprises a wafer stage 101 on which a semiconductor substrate 100 is placed, a wafer stage X and Y axes driving mechanism 102 and a wafer stage Z axis driving mechanism 103 which move the wafer stage 101 in its horizontal direction and height direction, respectively, and a mask stage 105 on which a mask 104 is placed. The present device further comprises a mask stage X and Y axes driving mechanism 106 and a mask stage Z axis driving mechanism 107 which move the mask stage 105 in its horizontal direction and height direction, respectively. The present device further comprises a light source 110 composed of a KrF excimer laser, an illuminating optical system 111 that guides excimer laser light from the light source 110 to illuminate the mask 104, a projecting optical system 120 that forms light transmitted through the mask 104 into an image on the semiconductor substrate 100, an alignment mark measuring optical system 131 that measures the position of a mark formed on the semiconductor substrate, and a selective heater 132. The present device further comprises a misalignment measuring section 133 that measures the magnitude of misalignment between a first misalignment mark formed in a lower layer and a second misalignment mark formed in an upper layer, on the basis of result of measurement carried out by the alignment mark measuring optical system 131, a focal-position measuring section 134 that determines an error in actual exposure position on the photosensitive film, and a dose measuring section 135 that determines an error in actual dose for the photosensitive film.

The selective heater 132 is adjusted to guide a fundamental wave (wavelength: 1,064 nm and pulse width: 5 nsec.) emitted by a Q-switch YAG laser provided outside the exposure device, into the exposure device via an optical fiber to irradiate and substantially heat the focal position of the alignment mark measuring optical system with this light.

Figure 2:
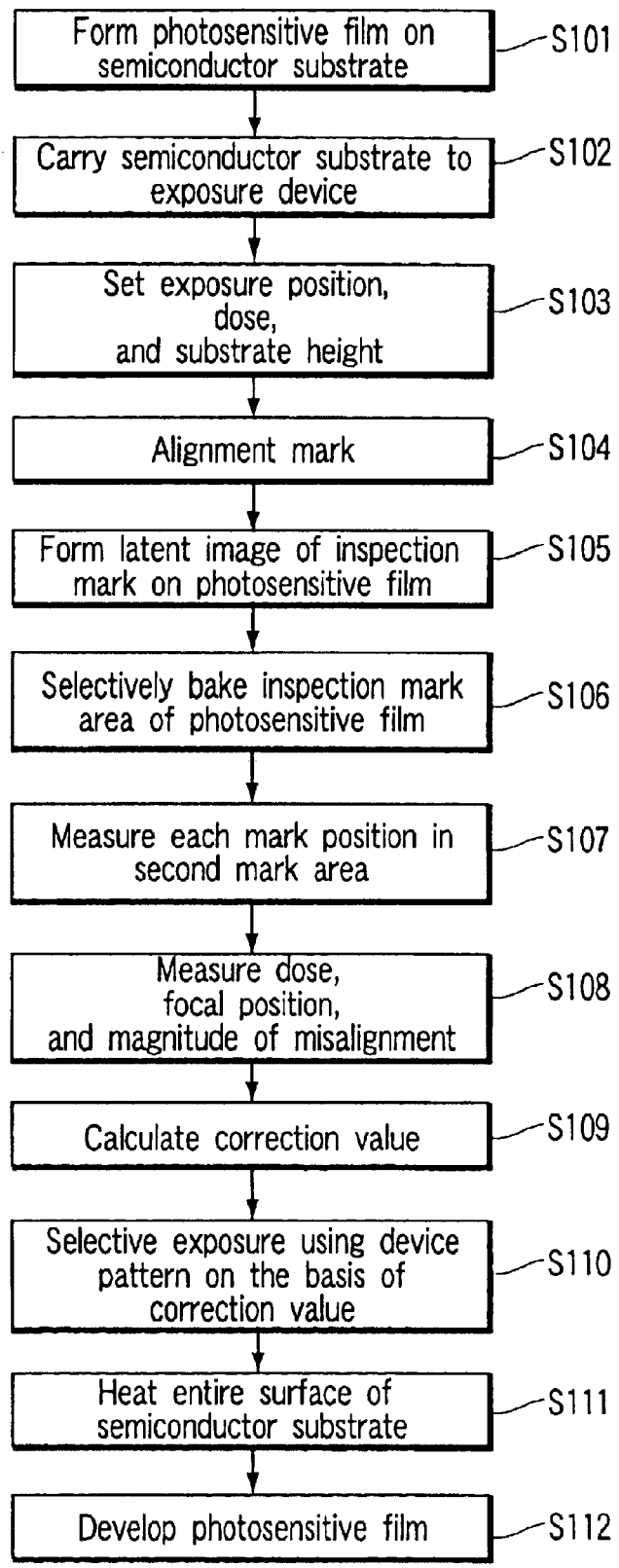
FIG. 2 is a flow chart of an exposure method according to the first embodiment.

With reference to the flow chart in FIG. 2, description will be given of a lithography step using the exposure device shown in FIG. 1.

(Step 101)

An alignment mark and a first misalignment inspection mark are formed both of which are used for alignment with a pattern formed in the upper layer. A semiconductor substrate is provided which is being manufactured. This semiconductor substrate is carried to a coater developer to form an antireflective film on the semiconductor substrate to prevent light from the KrF from being reflected. Then, a photosensitive film is formed.

(Step S102)

Figure 3A:
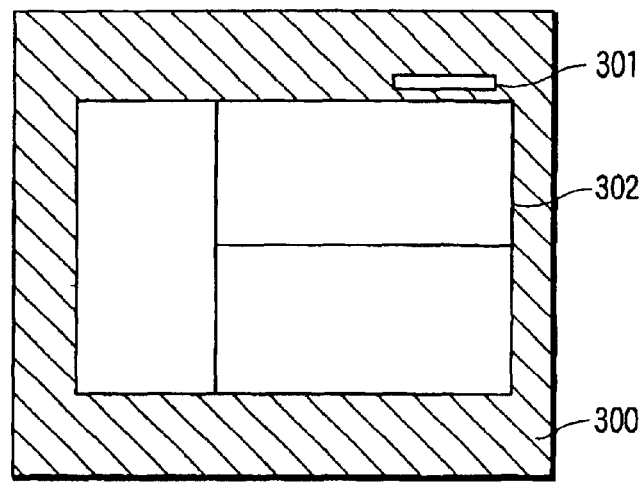
FIGS. 3A to 3C are plan views schematically showing masks provided in the exposure device shown n FIG. 1.

Then, the semiconductor substrate on which the antireflective film and the photosensitive film are formed is carried from the coater developer to an exposure device. The semiconductor substrate is mounted on the wafer stage 101. The exposure device has a mask mounted on the mask stage, the mask being shown in FIG. 3A. As shown in FIG. 3A, the mask 300 comprises an on-mask device pattern area 302 in which a device pattern is formed, and an on-mask inspection mark area 301 which is arranged in a peripheral portion of the on-mask device pattern area 302 and in which a pattern is formed, the pattern containing an on-mask misalignment inspection mark, an on-mask focal-position detection pattern, and an on-mask luminous-exposure detection pattern.

(Step S103)

Values for the horizontal position of the alignment mark, a substrate height position, dose, and the like are set for the exposure device, the alignment mark being formed on the semiconductor substrate in order to enable exposure using the pattern formed on the mask.

(Step S104)

The alignment mark measuring optical system 131, provided in the exposure device, is used to detect the position of the alignment mark disposed in the pattern in the lower layer of the semiconductor substrate. Then, on the basis of the detected position of the alignment mark and the exposure position set in step S103, the wafer stage X and Y axes driving mechanism 103 drives the wafer stage to move the semiconductor substrate to a position at which it is exposed to light using the pattern formed in the mask. Then, on the basis of the substrate height position, the wafer stage Z axis driving mechanism 103 adjusts the position of the semiconductor substrate in its height direction.

(Step S105)

Figure 3B:
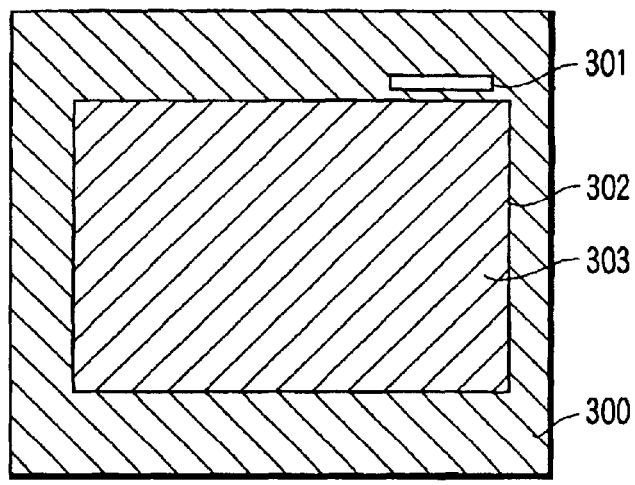

Then, as shown in FIG. 3B, the on-mask device pattern area 302, formed in the exposure mask, is shielded by a blind 303. The photosensitive film is selectively exposed to transfer the on-mask inspection mark area 301 to the photosensitive film, in which area the misalignment inspection mark, a dose measurement mark, and a focal-position measurement mark exist. The selective exposure forms an inspection mark area in the photosensitive film in which a latent image of each mark formed on the on-mask inspection mark area 301 is formed. The inspection mark area is a 60×200-μm rectangle on the semiconductor substrate.

(Step S106)

Then, the wafer stage X and Y axes driving mechanism 102 and the wafer stage Z axis driving mechanism 103 move the semiconductor substrate so as to install the inspection mark area substantially at a focal position of the alignment mark measuring optical system 131.

Then, the inspection mark area is selectively irradiated with light from the selective heater 132 to selectively heat the inspection mark area. The selective heating relieves the image of each mark from the inspection mark area. The light for the selective heating is a fundamental wave (wavelength: 1,064 nm and pulse width: 5 nsec.) from the Q-switch YAG laser. The light is shaped to form a 70×70-μm irradiated area on the semiconductor substrate. The laser irradiation is carried out three times by shifting the irradiated position by 70 μm each time. The amount of energy per shot is set at 2.45 mJ so that the photosensitive film can receive energy of 50 mJ/cm².

(Step S107)

Then, the alignment mark measuring optical system 131 of the exposure device is used to measure the positions and shapes of the three types of marks relieved by the selective heating.

(Step S108)

On the basis of results of measurements of the images of the three types of marks, the magnitude of misalignment, the actual dose for the photosensitive film, and the actual focal position are calculated. The misalignment measuring section 133 calculates the magnitude of misalignment. The focal-position measuring section 134 calculates the actual focal position. The dose measuring section 135 calculates the actual dose. Table 1 shows the results of the calculations.

TABLE 1

|  | Magnitude of misalignment x (μm) | Magnitude of misalignment Y (μm) | Magnitude of misalignment θ (degree) | Dose (mJ/cm²) | focal position (μm) |
|---|---|---|---|---|---|
| Set value | 0 | 0 | 0 | 21.0 | −0.2 |
| Measured value | 0.030 | −0.025 | 0.03 | 21.8 | −0.5 |
| Correction value | −0.030 | 0.025 | −0.03 | 20.2 | 0.3 |

The correction values shown in Table 1 are calculated by comparing the set values with the corresponding measured values. The correction values for the magnitude of misalign ment and the focal position are determined using Equation (1).

$$\text{Correction value} = \text{set value} - \text{measured value} \quad (1)$$

Further, the correction value for the dose is determined using Equation (2).

$$\text{Correction value} = \text{set value} \times \text{set value/measured value} \quad (2)$$

(Step S109)

Then, on the basis of the calculated correction values, the set values for the exposure device are changed so that actual exposure conditions conform to the set values. The set values for the misalignment and focal position (substrate height position) are changed by adding the correction values to the set values. A new correction value is set for the dose. In this case, the horizontal and height positions of the substrate may be corrected manually or automatically by the exposure device. In the present embodiment, the three parameters, i.e. the magnitude of misalignment, the focus value, and the dose are measured and corrected. However, the present invention is not limited to these parameters. It is possible to measure and correct only one of the three parameters which is unstable.

(Step S110)

Figure 3C:
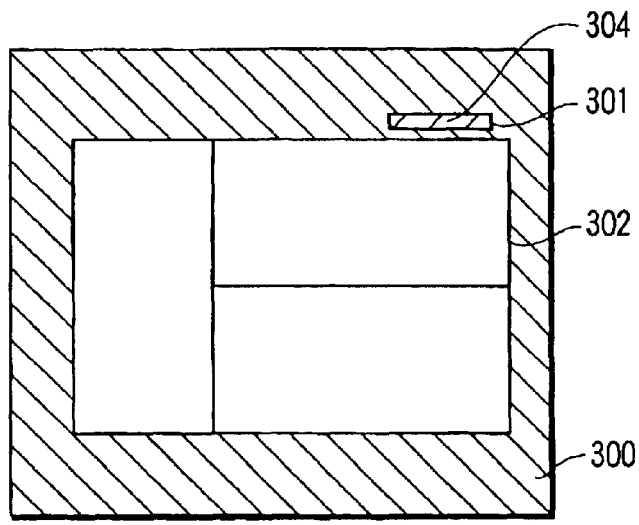

As shown in FIG. 3C, the on-mask inspection mark area 301 is covered with the blind 302. Then, exposure is carried out using the on-mask device pattern area 302.

(Steps S111 and 112)

The semiconductor substrate is heated to heat the entire surface of the photosensitive film. Subsequently, the photosensitive film is developed to form a photosensitive film pattern.

When a misalignment inspection was carried out after the entire surface had been exposed as in the conventional approach, the percentage of resulting semiconductor devices that had to be re-wrought because the magnitude of misalignment was out of an allowable range was 10%. The percentage of resulting semiconductor devices that had to be re-wrought because of an error in dose was 2%. The percentage of resulting semiconductor devices that had to be re-wrought because of a focus error was 5%. However, the approach shown in the present embodiment could reduce each of these percentages to 0.2% or less. These values are much smaller than the corresponding values obtained using the conventional approach. These values are determined by the reproducibility of the exposure device.

The present embodiment relates to exposure carried out using KrF as a light source. However, the present invention is not limited to this light source, but is applicable to the manufacture of semiconductor devices using any exposure light sources such as ArF, $F_2$ lasers, and EUV.

In the present embodiment, the second mark area is heated using a fundamental wave (wavelength: 1,064 mm) from the Q-switch YAG laser, and the amount of energy per unit area is 50 mJ/cm². The irradiation wavelength and the amount of energy are not limited to these values. For example, the irradiation source may be the halogen lamp disclosed in Jpn. Pat. Appln. KOKAI Publication No. 2001-44130 and used as an infrared lamp heater, a red semiconductor laser, or a LED.

In this case, it has been confirmed that similar effects are produced by setting the amount of energy E (mJ/cm²) with respect to the transmissivity (<1) and reflectivity (<1) of light of a wavelength λ for the second mark area of the semiconductor substrate (including a thin film formed on the semiconductor substrate) as shown in Equation (3).

$$\frac{5}{1 - (\text{Transmissivity} + \text{Reflectivity})} < \quad (3)$$

$$E < \frac{20}{1 - (\text{Transmissivity} + \text{Reflectivity})}$$

The heating means may be the alignment mark measuring optical system itself. The amount of energy for heating may be determined on the basis of Equation (3).

Even if the irradiated are is very small, consideration must be given to diffusion of heat from the irradiated point to the substrate. Even if the amount of energy is within the range shown in Equation (3), if the irradiated area is hot and the temperature is at least 100° C. near the irradiated area, then it is desirable to provide a cooling function for a stage holding the semiconductor substrate, blow cold air against the surface of the semiconductor substrate, or provide other arrangements in order to cool the semiconductor substrate. In this case, it is desirable to suppress an increase in temperature in the device pattern area so that the temperature of the photosensitive film is equal to or lower than the one at which the substances in the photosensitive film shows a chemical reaction, preferably equal to or lower than 70° C.

The present embodiment is characterized in that the image of the inspection mark is relieved inside the exposure device and in that the observing system inside the exposure device then measures the inspection mark and feeds back the results to correct exposure. It is possible to use a well-known inspection mark as it is or to modify such a mark.

For the alignment mark and measuring method described above, the mark disclosed in Jpn. Pat. Appln. KOKAI Publication No. 2000-122304 and other marks are applicable. Jpn. Pat. Appln. KOKAI Publication No. 2000-122304 also discloses a mark that enables aberration to be measured, and measurements can be easily carried out using this mark.

Further, the mark disclosed in FIGS. 1, 2, 9, 13, 14, and other figures in Jpn. Pat. Appln. KOKAI Publication No. 2000-12425 can be used as the dose measurement mark. Measurements can also be carried out on the basis Jpn. Pat. Appln. KOKAI Publication No. 2000-12425.

The pattern disclosed in FIG. 14 in Jpn. Pat. Appln. KOKAI Publication No. 2000-12425 can be used as the focus value measurement mark. The focus value can be determined utilizing the nature that the dimension of a longer side of the mark is largest with the best focus value and decreases as defocusing becomes more and more marked.

Figure 4:
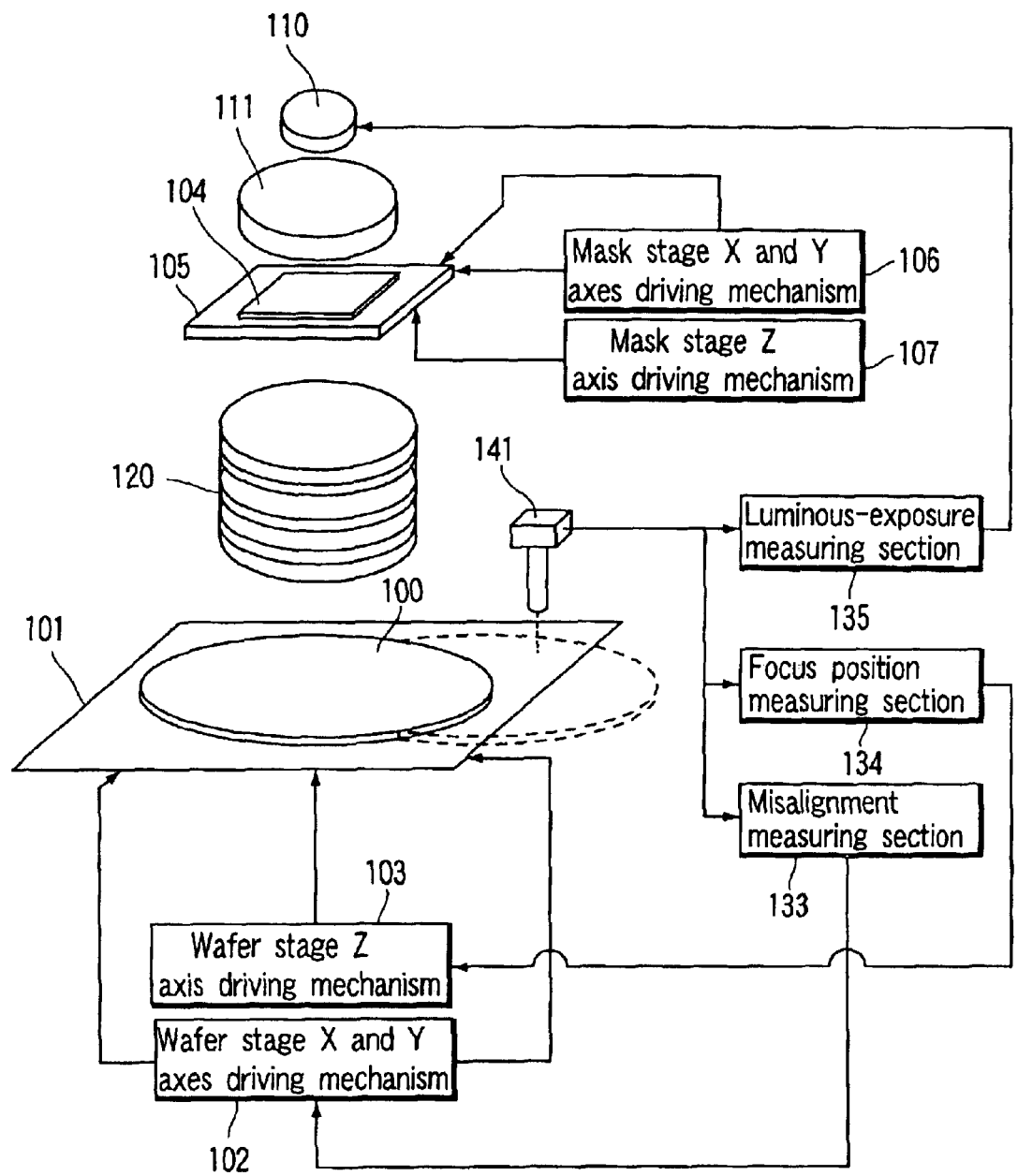
FIG. 4 is a view showing a configuration of the exposure device according to the present invention.

The selective heater may be a light source independent of the alignment mark measuring optical system. However, the irradiating section of the alignment mark measuring optical system is preferably used as the selective heater as it is. In most cases, a sufficient amount of energy for heating cannot be obtained from the irradiating section of the alignment mark measuring optical system. However, the exposure device shown in FIG. 4 does not require any selective heaters. FIG. 4 is a view showing a configuration of the exposure device according to the first embodiment of the present invention. In FIG. 4, the same parts as those in FIG. 1 are denoted by the same reference numerals. Their description is omitted.

The exposure device in FIG. 4 comprises a light intensity adjusting mechanism that adjusts the intensity of light emitted by the irradiating section. Output from the irradiating section of the alignment mark measuring optical system 131 has been improved enough to heat the photosensitive film. For example, to allow the mark to be observed, the light intensity adjusting mechanism 141 arranges an extinction filter on an optical path of light emitted by the alignment mark measuring system 131. When the photosensitive film is heated, the light intensity adjusting mechanism 141 does not arrange the extinction filter on the optical path.

According to the present embodiment, the on-mask inspection mask is used to selectively expose the photosensitive mark to form a latent image of the inspection mark on the photosensitive film. The area in which the latent image of the inspection mark is formed is selectively heated to relieve images of the misalignment inspection mark, dose measuring mark, and focal-position measuring mark. Then, these images can be measured to determine the deviations of the superimposed position, dose, and focal position from corresponding set values. The set values for the exposure device used for selective exposure using the inspection mark are corrected on the basis of the deviations from the set values. Then, the device pattern is used to expose the photosensitive film. When the device pattern is used to expose the photosensitive film, it is possible to reduce the deviations of the formed pattern from the corresponding set values because the deviations have already been corrected. This eliminates the need for reworking to enable an increase in manufacturing cost to be suppressed.

Further, heating outside the exposure device increases the time required for unloading heating, transportation, and manufacturing. Accordingly, the selective heating is preferably carried out inside the exposure device.

(Second Embodiment)

Figure 5:
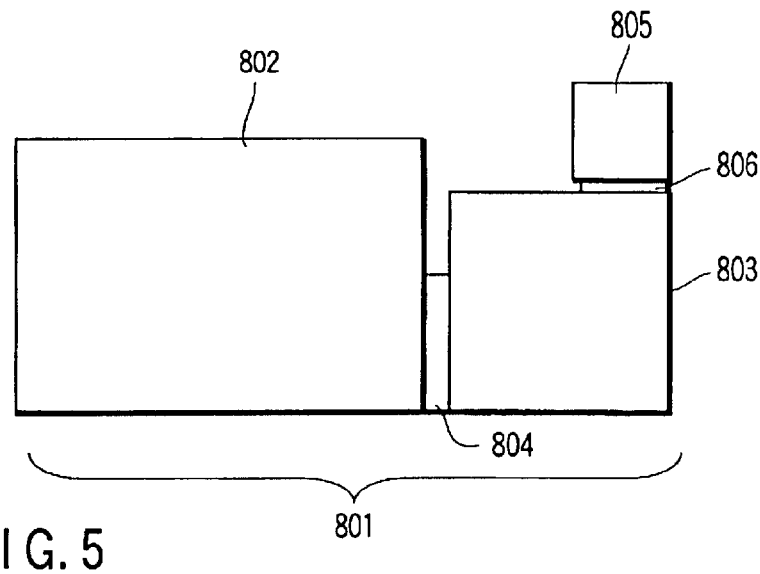
FIG. 5 is a block diagram schematically showing a processing apparatus according to a second embodiment.
Figure 6:
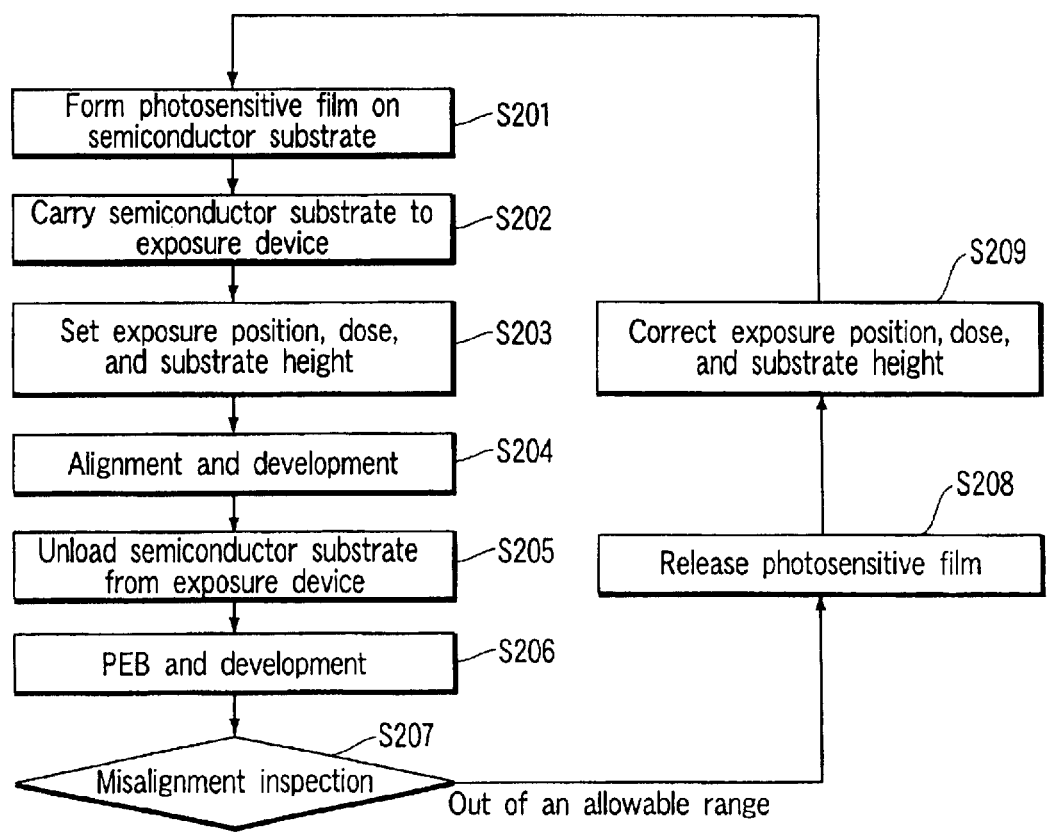
FIG. 6 is a flow chart showing a conventional exposure method.

The present embodiment relates to a method for manufacturing a semiconductor using ArF (193 nm) as an exposure light source. In this example, description will be given of the case in which the entire surface of a substrate is heated in order to allow a second inspection mark to be recognized in contrast with the first embodiment. FIG. 5 is a block diagram schematically showing a configuration of a processing apparatus according to the second embodiment.

As shown in FIG. 5, the processing apparatus 801 is composed of a coater developer 802 that performs a coating, heating, and developing operations, and an exposure device 803. The coater developer 802 and the exposure device 803 are connected together using an interface 804 so that the substrate can be moved between the coater developer 802 and the exposure device 803. The exposure device 803 is provided with a hot plate 805 that can be heated at a predetermined processing temperature. The substrate can be moved between the hot plate 805 and the exposure device 803 via a carrying unit 806.

Description will be given of a processing method using the present apparatus 801.

An alignment mark is provided on the semiconductor substrate for alignment with a pattern located over the substrate. An antireflective film is formed on the semiconductor substrate to prevent ArF light as exposure light from being reflected. Then, a photosensitive film is coated and heated at 110° C. for 60 seconds for film formation. Then, the semiconductor substrate is carried to the exposure device 803 via the interface 804. The exposure device 803 is the one shown in FIG. 1 from which the selective heater 132 is omitted.

The exposure device 803 comprises an alignment mechanism that detects the position of a lower layer pattern. The alignment mechanism calculates the exposed position on the photosensitive film by detecting the position of the alignment mark arranged under the photosensitive film of the semiconductor substrate. On the basis of the positional information, the wafer stage X and Y axes driving mechanism is used to move the semiconductor substrate to the position at which exposure is carried out using the pattern. Then, the on-mask device pattern is blinded, and selectively expose the photosensitive film to transfer the on-mask inspection mark area to the photosensitive film. Thus, a latent image of each mark is formed in the inspection mark area of the photosensitive film. The inspection mark area is a 50×60-μm rectangle on the semiconductor substrate.

After the exposure using the on-mask inspection mark area, the carrying unit 806 carries the semiconductor substrate to the hot plate 805. Then, the hot plate 805 is used to heat the semiconductor substrate at 110° C. for 30 seconds. The entire surface of the photosensitive film is thus heated to relieve the image of each mark formed in the inspection mark area. Furthermore, the semiconductor substrate is cooled to the room temperature using a cooling unit (not shown). Subsequently, the carrying unit 806 carries the semiconductor substrate to the exposure device 803.

The alignment mark measuring optical system of the exposure device 803 is used to measure the image of each mark relieved by heating the entire surface of the substrate using the hot plate 805. Thus, the magnitude of misalignment is determined on the basis of the misalignment mark. Further, a possible error resulting from the selective exposure using the inspection mark is measured. On the basis of result of this measurement, a correction value is calculated. The correction value may be calculated using, for example, the method described in the first embodiment.

Then, the correction value for misalignment is reset for the exposure device 803. Exposure is then carried out using the device pattern area of the exposure mask. In this regard, with the photosensitive film used in the present embodiment, its sensitivity remained unchanged even when the heating process is executed before the exposure to relieve the image of the second inspection mark. Accordingly, the conventional dose condition was used for the exposure. After the exposure has been finished, the semiconductor substrate is carried to the coater developer 802 via the interface 804. Then, a heating and development operations are performed to form a photosensitive film pattern.

According to the present embodiment, the percentage of resulting semiconductor devices that had to be re-wrought is 0.25%, which is substantially lower than 13% in the prior art.

With the photosensitive film used in the present embodiment, its sensitivity remained unchanged even when the heating process is executed before the exposure to relieve the image of the inspection mark. However, whether or not the sensitivity changes depends on material and heating conditions for the photosensitive film. If the sensitivity changes, the desired device pattern dimensions can be easily accomplished by determining a change in sensitivity that may be occur in the exposed area to which the device pattern is transferred and then correcting any one of the dose used to transfer the device, the temperature for the heating process executed after the transfer of the device, and the time required for the heating process.

In the present embodiment, the hot plate is used as the heating means for relieving the latent image of the inspection mark. However, the present invention is not limited to this heating means. Similar effects can be produced using, for example, a heating source such as the lamp heater disclosed in Jpn. Pat. Appln. KOKAI Publication No. 2001-44130.

Further, in the description of the present embodiment, the heating means for relieving the latent image of the inspection mark is installed adjacent to the exposure device. However, the present invention is not limited to this aspect. The heating means may be provided inside the exposure device. Alternatively, the heating unit in the coater developer may be used for heating. In this case, it should be appreciated that the hot plate installed adjacent to or inside the exposure device is not required.

The present invention is characterized in that the latent image of the inspection mark is relieved inside the exposure device and in that the observing system inside the exposure device then measures the inspection mark and feeds back the results to correct exposure. It is possible to use a well-known inspection mark as it is or to modify such a mark.

For the alignment mark and measuring method described above, the mark disclosed in Jpn. Pat. Appln. KOKAI Publication No. 2000-122304 and other marks are applicable. Jpn. Pat. Appln. KOKAI Publication No. 2000-122304 also discloses a mark that enables aberration to be measured, and measurements can be easily carried out using this mark.

Further, in the present embodiment, the misalignment mark has been described. However, the present embodiment is not limited to this mark but is applicable to a dose measurement mark or a focus error measurement mark.

The mark disclosed in FIGS. 1, 2, 9, 13, 14, and other figures in Jpn. Pat. Appln. KOKAI Publication No. 2000-12425 can be used as the dose measurement mark. Measurements can also be carried out on the basis Jpn. Pat. Appln. KOKAI Publication No. 2000-12425.

The pattern disclosed in FIG. 14 in Jpn. Pat. Appln. KOKAI Publication No. 2000-12425 can be used as the focus value measurement mark. The focus value can be determined utilizing the nature that the dimension of a longer side of the mark is largest with the best focus value and decreases as defocusing becomes more and more marked.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, the method comprising:

forming a photosensitive film on a main surface of a semiconductor substrate;

carrying the semiconductor substrate on which the photosensitive film is formed, to an exposure device provided with a mask in which an on-mask inspection mark and an on-mask device pattern are formed to form an inspection mark and a device pattern, respectively, on the photosensitive film;

selectively exposing the photosensitive film to light to transfer the on-mask inspection mark to the photosensitive film to form a latent image of the inspection mark on the photosensitive film;

heating at least that area of the photosensitive film in which the latent image of the inspection mark is formed, to relieve the image of the inspection mark;

measuring the relieved image of the inspection mark;

changing set values for the exposure device used for the selective exposure, on the basis of result of the measurement so that exposure conditions conform to the set values;

exposing the photosensitive film on the basis of the changed set values to transfer the on-mask device pattern to the photosensitive film to form a latent image of the device pattern on the photosensitive film;

heating an entire surface of the photosensitive film; and developing the photosensitive film.

2. The method for manufacturing a semiconductor device according to claim 1, wherein an alignment mark is formed on the main surface of the semiconductor substrate, and alignment is carried out by detecting, before the selective exposure using the on-mask inspection mark, a position of the alignment mark inside the exposure device, and on the basis of a result of the detection, calculating a position at which the photosensitive film is exposed to light to transfer the pattern formed in the mask to the photosensitive film.

3. The method for manufacturing a semiconductor device according to claim 1, wherein the heating of at least the area in which the latent image of the inspection mark is formed is selective heating of the area in which the latent image of the inspection mark on the photosensitive film is formed.

4. The method for manufacturing a semiconductor device according to claim 1, wherein the photosensitive film is heated inside the exposure device.

5. The method for manufacturing a semiconductor device according to claim 1, wherein the photosensitive film is heated by irradiating the area in which the latent image of the inspection mark is formed, with light containing a wavelength absorbed by a film material formed on the semiconductor substrate.

6. The method for manufacturing a semiconductor device according to claim 1, wherein the heating of at least the area in which the latent image of the inspection mark is formed is heating of an entire surface of the photosensitive film, and at least one of dose used for exposure using the on-mask device pattern, temperature at which the entire surface is heated, and time required to heat the entire surface is corrected on the basis of a change in sensitivity of the photosensitive film to exposure light which change is caused by the heating.

7. The method for manufacturing a semiconductor device according to claim 1, wherein a first misalignment mark is formed on the main surface of the semiconductor substrate, a second misalignment mark is formed on the photosensitive film as an inspection mark, when the image of the inspection mark is measured, a magnitude of misalignment between a position of the first misalignment between a position of the first misalignment inspection mark and a position of the second misalignment inspection mark is measured, and set values for the exposure device are changed so as to zero the measured magnitude of misalignment.

8. The method for manufacturing a semiconductor device according to claim 1, wherein a dose measurement mark is formed on the photosensitive film as an inspection mark, an actual dose for the photosensitive film is calculated on the basis of a result of detection of the dose measurement mark, and the set value for the exposure device are changed so that the dose for the photosensitive film equals a corresponding set value.

9. The method for manufacturing a semiconductor device according to claim 1, wherein a focal-position measurement mark is formed on the photosensitive film as the inspection mark, a focal position of exposure light applied to the photosensitive film is calculated on the basis of a shape of the focal-position measurement mark, and the set values for the exposure device used for the selective exposure are changed to zero a deviation of the focal position from a corresponding set value.

10. An apparatus for manufacturing a semiconductor device, the apparatus comprising:
   a substrate holding section configured to hold a substrate including a semiconductor substrate a potosensitive film above the semiconductor substrate, and a first alignment mark between the semiconductor substrate and the photosensitive film;
   an exposure mask holding section configured to hold an exposure mask having an on-mask device pattern area and an on-mask inspection mark area, wherein the on-mask inspection mark area includes an on-mask second alignment mark, and wherein the on-mask inspection mark area is to be transferred to a region of the photosensitive film to form a latent image of the second alignment mark on the photosensitive film;
   a light source;
   an illuminating optical system configured to irradiate the exposure mask with a light from the light source;
   a projecting optical system configured to project light transmitted through the exposure mask on the photosensitive film;
   an alignment mark measuring optical system configured to detect a position of the first alignment mark and the latent image of the second alignment mark; and
   a heating portion configured to selectively heat the region of the photosensitive film by irradiating the region with light.

11. The apparatus for manufacturing a semiconductor device according to claim 10, wherein a position of the substrate heated by the heating portion substantially coincides with a focal position of the alignment mark measuring optical system which detects the position of the alignment mark formed on the substrate.

12. The apparatus for manufacturing a semiconductor device according to claim 10, wherein a wavelength of light emitted by the heating portion has a wavelength range in which the substrate or a thin film formed on the substrate has an absorbance larger than 0.

13. The apparatus for manufacturing a semiconductor device according to claim 10, wherein the heating portion is an irradiating section of the alignment mark measuring optical system.

14. The apparatus for manufacturing a semiconductor device according to claim 13, wherein the alignment mark measuring optical system further comprises a light intensity adjusting mechanism which adjusts an intensity of light applied to the photosensitive film.

15. The apparatus for manufacturing a semiconductor device according to claim 10, wherein the on-mask inspection mark area further includes an on-mask focal-position detection pattern to form a latent image of a focal-position detection pattern on the region, and the alignment mark measuring optical system measures a length of the latent image of the focal-position detection pattern.

16. The apparatus for manufacturing a semiconductor device according to claim 10 wherein the on-mask inspection mark area further includes an on-mask luminous-exposure detection pattern to form a latent image of luminous-exposure detection pattern on the region, and the alignment mark measuring optical system measures a length of the latent image of the luminous-exposure detection pattern.

* * * * *

UNITED STATES PATENT AND TRADEMARK OFFICE
CERTIFICATE OF CORRECTION

PATENT NO. : 7,018,932 B2
APPLICATION NO. : 10/377597
DATED : March 28, 2006
INVENTOR(S) : Ito et al.

Page 1 of 1

It is certified that error appears in the above-identified patent and that said Letters Patent is hereby corrected as shown below:

Column 11,
Line 7, change "substrate" to -- substrate, --.
Line 7, change "potosensitive" to -- photosensitive.--.

Signed and Sealed this

Fourth Day of July, 2006

JON W. DUDAS
*Director of the United States Patent and Trademark Office*